(12) United States Patent
Etzkorn et al.

(10) Patent No.: US 11,424,171 B1
(45) Date of Patent: Aug. 23, 2022

(54) MINIATURIZED ELECTRONIC DEVICES AND RELATED METHODS

(71) Applicant: Verily Life Sciences LLC, South San Francisco, CA (US)

(72) Inventors: James Etzkorn, Mountain View, CA (US); Can Cai, Menlo Park, CA (US)

(73) Assignee: VERILY LIFE SCIENCES LLC, South San Francisco, CA (US)

( * ) Notice: Subject to any disclaimer, the term of this patent is extended or adjusted under 35 U.S.C. 154(b) by 120 days.

(21) Appl. No.: 17/061,207

(22) Filed: Oct. 1, 2020

Related U.S. Application Data (62) Division of application No. 16/259,064, filed on Jan. 28, 2019, now Pat. No. 10,811,330.

(60) Provisional application No. 62/625,517, filed on Feb. 2, 2018.

(51) Int. Cl.
| | |
|---|---|
| *H01L 23/31* | (2006.01) |
| *H01L 23/04* | (2006.01) |
| *H01L 23/10* | (2006.01) |
| *H01L 21/50* | (2006.01) |

(52) U.S. Cl.
CPC .......... *H01L 23/3121* (2013.01); *H01L 21/50* (2013.01); *H01L 23/04* (2013.01); *H01L 23/10* (2013.01); *H01L 23/3114* (2013.01)

(58) Field of Classification Search
CPC ..... H01L 23/3121; H01L 21/50; H01L 23/04; H01L 23/10
See application file for complete search history.

(56) References Cited

U.S. PATENT DOCUMENTS

| | | | |
|---|---|---|---|
| 6,866,901 | B2 | 3/2005 | Burrows et al. |
| 9,050,622 | B2 | 6/2015 | Aitken et al. |
| 9,681,555 | B2 | 6/2017 | Chen |
| 2007/0040501 | A1 | 2/2007 | Aitken et al. |

OTHER PUBLICATIONS

U.S. Appl. No. 16/259,064, "Ex Parte Quayle Action", Mar. 25, 2020, 6 pages.
U.S. Appl. No. 16/259,064, "Notice of Allowance", dated Jun. 18, 2020, 7 pages.

*Primary Examiner* — Anthony Ho
(74) *Attorney, Agent, or Firm* — Kilpatrick Townsend & Stockton LLP (57) ABSTRACT

Miniaturized sealed electronic devices and methods of making and using them are disclosed herein. The miniaturized sealed electronic device disclosed herein includes an electronic device, an electrically insulating substrate, a barrier layer (e.g., a barrier material thin film, and/or a barrier material cap), cured adhesive and a sealant. The miniaturized sealed electronic device is made using methods described herein to create a small footprint, with minimal encapsulation, as compared to sealed electronic devices made by traditional methods.

21 Claims, 6 Drawing Sheets

MINIATURIZED ELECTRONIC DEVICES AND RELATED METHODS

CROSS-REFERENCE TO RELATED APPLICATION

The present application is a divisional of U.S. Nonprovisional application Ser. No. 16/259,064, filed Jan. 28, 2019, which claims the benefit of priority to U.S. Provisional Application No. 62/625,517, filed Feb. 2, 2018, the entire contents of each of which are incorporated by reference herein for all purposes.

BACKGROUND

Implantable electronics is a rapidly progressing field. Incorporating electronic devices into living subjects presents the challenges of creating micro-electronic devices encapsulated and safe for corporal implant. To date, however, providing ultra-small, safe, and environmentally stable electronic devices that can survive the lifetime of the subject in a moist and oxygen-rich environment has proven problematic.

SUMMARY

Electronic devices (e.g., solid state batteries, light emitting diodes, photovoltaic devices, sensors, or any suitable electronic device) can degrade significantly in an environment containing moisture and oxygen. Provided herein are methods of sealing an electronic device for incorporation into systems placed in environments containing moisture and oxygen (e.g., implantation into a body). Also provided herein are methods to further miniaturize (i.e., reduce the footprint of) electronic devices by providing encapsulation that is significantly reduced in area but still effective (i.e., forming a comparable or improved barrier) as compared to conventional sealing methods.

The present disclosure provides a method of making a sealed electronic device, comprising (a) coating a sacrificial carrier substrate with a releasable adhesive solution; (b) positioning an electrically insulating substrate onto the releasable adhesive solution; (c) curing the releasable adhesive solution to adhere the electrically insulating substrate to the sacrificial carrier substrate, thereby forming an electrically insulating layer releasably attached to the sacrificial carrier substrate; (d) positioning an electronic device on the electrically insulating layer; (e) depositing a curable adhesive over and about the electronic device to surround the electronic device; (f) positioning a barrier material on the curable adhesive; (g) curing the curable adhesive to provide a sealed barrier layer comprising a cured adhesive and the barrier material; (h) cutting the sealed barrier layer and the electrically insulating layer about the electronic device to provide at least a first cut perimeter about the electronic device, wherein cutting the sealed barrier layer and the electrically insulating layer about the electronic device provides a first cut perimeter channel about the electronic device; (i) depositing a curable sealant to fill the first cut perimeter channel about the electronic device; (j) curing the curable sealant to create a sealed electronic device comprising the electrically insulating substrate, the electronic device, and the sealed barrier layer, surrounded by a cured sealant, wherein the sealed electronic device is releasably attached to sacrificial carrier substrate; and (k) releasing the releasable adhesive to remove the sacrificial carrier substrate from the sealed electronic device.

In certain embodiments, the method further comprises after the cutting step (h), cutting the sealed barrier layer and the electrically insulating layer to provide a second cut perimeter concentrically larger than the first cut perimeter about the electronic device; and removing the sealed barrier layer and the electrically insulating layer between the first cut perimeter and the second cut perimeter to provide a wide channel surrounding the electronic device, wherein the wide channel comprises a width equal to the first cut perimeter channel plus the second cut perimeter plus a distance from the first cut perimeter channel to the second cut perimeter.

In certain embodiments, the method further comprises after the cutting step (h), depositing a second curable adhesive over the electronic device; and positioning a barrier material cap over and about the electronic device, wherein the barrier material cap is configured to cover the electronic device and extend into the first cut perimeter channel about the electronic device, thereby encapsulating the electronic device and the second curable adhesive.

In certain embodiments, positioning an electronic device on the electrically insulating layer comprises positioning a plurality of electronic devices, wherein the plurality of electronic devices are positioned on the electrically insulating layer with sufficient spacing to create a channel surrounding each electronic device in the plurality. In certain embodiments, the releasable adhesive is selected from the group consisting of a photodegradable adhesive, a chemically degradable adhesive, and a thermally degradable adhesive, or a combination thereof. In certain embodiments, removing the sealed barrier layer and the electrically insulating layer between the first cut perimeter and the second cut perimeter to provide the wide channel surrounding the electronic device comprises releasing the releasable adhesive in the wide channel. In certain embodiments, the releasable adhesive is a photodegradable adhesive and wherein the releasing comprises exposing the photodegradable adhesive to a wavelength of light suitable to break adhesive bonds in the photodegradable adhesive. In certain embodiments, the releasable adhesive is a thermally degradable adhesive and wherein the releasing comprises exposing the thermally degradable adhesive to a temperature sufficient to break adhesive bonds in the thermally degradable adhesive. In certain embodiments, the releasable adhesive is a chemically degradable adhesive and wherein the releasing comprises exposing the chemically degradable adhesive to a chemical sufficient to break adhesive bonds in the chemically degradable adhesive.

In certain embodiments, the curable adhesive comprises one or more of a photo-curable adhesive, a thermally curable adhesive, and a chemically curable adhesive. In certain embodiments, the curable sealant comprises one or more of a photo-curable adhesive, a thermally curable adhesive, and a chemically curable adhesive. In certain embodiments, the curable adhesive and the curable sealant comprise a photo-curable adhesive and sealant, and wherein the curing steps comprise exposing the photo-curable adhesive and sealant to a wavelength of light suitable to cure the photo-curable adhesive and sealant. In certain embodiments, the curable adhesive and the curable sealant comprise a thermally curable adhesive and sealant, and wherein the curing steps comprise exposing the thermally curable adhesive and sealant to a temperature sufficient to cure the thermally curable adhesive and sealant.

The present disclosure also provides a method of making a sealed electronic device, comprising (a) coating a sacrificial carrier substrate with a releasable adhesive solution; (b) positioning an electrically insulating substrate onto the releasable adhesive solution; (c) curing the releasable adhesive solution to adhere the electrically insulating substrate to the sacrificial carrier substrate, thereby forming an electrically insulating layer releasably attached to the sacrificial carrier substrate; (d) positioning an electronic device on the electrically insulating layer; (e) depositing a first curable adhesive over and about the electronic device to surround the electronic device; (f) positioning a barrier material cap over and about the electronic device, wherein the barrier material cap is configured to cover the electronic device and extend into the first curable adhesive and the electrically insulating layer, thereby encapsulating the electronic device and the first curable adhesive; (g) curing the curable adhesive to create a sealed electronic device comprising the electrically insulating substrate, the electronic device, and the curable adhesive, surrounded by the barrier material cap, wherein the sealed electronic device is releasably attached to the sacrificial carrier substrate; and (h) releasing the releasable adhesive to remove the sacrificial carrier substrate from the sealed electronic device.

The present disclosure also provides a sealed electronic device, comprising an electrically insulating layer and a barrier layer with an electronic device between the electrically insulating layer and the barrier layer, wherein the electronic device is encapsulated by a first cured adhesive and wherein the electrically insulating layer and a barrier layer have a perimeter that is greater than the perimeter of the electronic device; and a sealant at the perimeter of the electrically insulating layer and the barrier layer. In certain embodiments, the sealant is selected from the group consisting of a thermoplastic polymer, a thermoset resin, an epoxy, and a metal. In certain embodiments, the barrier layer comprises a barrier layer thin film positioned over and beyond a perimeter of the electronic device or a barrier layer cap positioned over and about the electronic device. In certain embodiments, the barrier layer cap is configured to be sealed to the electrically insulating layer about a perimeter of the electronic device. In certain embodiments, the barrier layer cap comprises glass, ceramic, polymer, and metal. In certain embodiments, the barrier layer cap is thermally sealed to the electrically insulating layer, is chemically sealed to the electrically insulating layer, or is photo-curably sealed to the electrically insulating layer.

The term embodiment and like terms are intended to refer broadly to all of the subject matter of this disclosure and the claims below. Statements containing these terms should be understood not to limit the subject matter described herein or to limit the meaning or scope of the claims below. Embodiments of the present disclosure covered herein are defined by the claims below, not this summary. This summary is a high-level overview of various aspects of the disclosure and introduces some of the concepts that are further described in the Detailed Description section below. This summary is not intended to identify key or essential features of the claimed subject matter, nor is it intended to be used in isolation to determine the scope of the claimed subject matter. The subject matter should be understood by reference to appropriate portions of the entire specification of this disclosure, any or all drawings and each claim.

BRIEF DESCRIPTION OF THE DRAWINGS

In the following detailed description, reference is made to the accompanying figures, which form a part hereof. In the figures, similar symbols typically identify similar components, unless context dictates otherwise. The illustrative embodiments described in the detailed description, figures, and claims are not meant to be limiting. Other embodiments may be utilized, and other changes may be made, without departing from the scope of the subject matter presented herein. It will be readily understood that the aspects of the present disclosure, as generally described herein, and illustrated in the figures, can be arranged, substituted, combined, separated, and designed in a wide variety of different configurations, all of which are explicitly contemplated herein. The elements included in the figures herein may not be drawn to scale.

DETAILED DESCRIPTION

The present disclosure relates to implantable electronic devices. Disclosed herein are electronic devices sealed within an encapsulation and methods of making and using the implantable sealed electronic devices. The sealed electronic devices are fabricated with a reduced surface area (i.e., a reduced footprint) by positioning an electronic device on a first side of a suitable electrically insulating substrate. The substrate can then be attached to a sacrificial carrier substrate by applying a releasable adhesive onto a second side of the electrically insulating substrate (e.g., a side opposite the first side having the electronic device positioned thereupon) and subsequently attaching the electrically insulating substrate to the sacrificial carrier substrate. A curable adhesive can be deposited over and about the electronic device, thus covering a top of the electronic device and surrounding all sides of the electronic device, effectively encapsulating the electronic device in the curable adhesive. A barrier material can be deposited or layered over the curable adhesive to further form a barrier layer (e.g., a seal) over the electronic device. Reducing the footprint of the implantable electronic device can be achieved by subsequently carving a channel about the electronic device into the barrier layer and the curable adhesive layer, thus creating a perimeter channel about the electronic device. The perimeter channel can be as close as possible to the electronic device without exposing a side of the electronic device through the curable adhesive. A curable sealant can be deposited into the perimeter channel, as well as over the barrier layer, to further seal the top of the electronic device and provide an edge seal about the electronic device. After sealing and/or curing, the electronic device, having been rendered implantable by the above described sealing method, can be released from the sacrificial carrier substrate by releasing the releasable adhesive, providing the sealed electronic device.

Provided herein are novel methods of making an encapsulated/sealed electronic device that includes (a) an electronic device, (b) a top seal over the electronic device and (c) an edge seal, wherein the edge seal is positioned close to the electronic device. By minimizing the size of the edge seal, the size of the encapsulated electronic device is much reduced as compared to the size of electronic devices produces by traditional methods.

Figure 1:
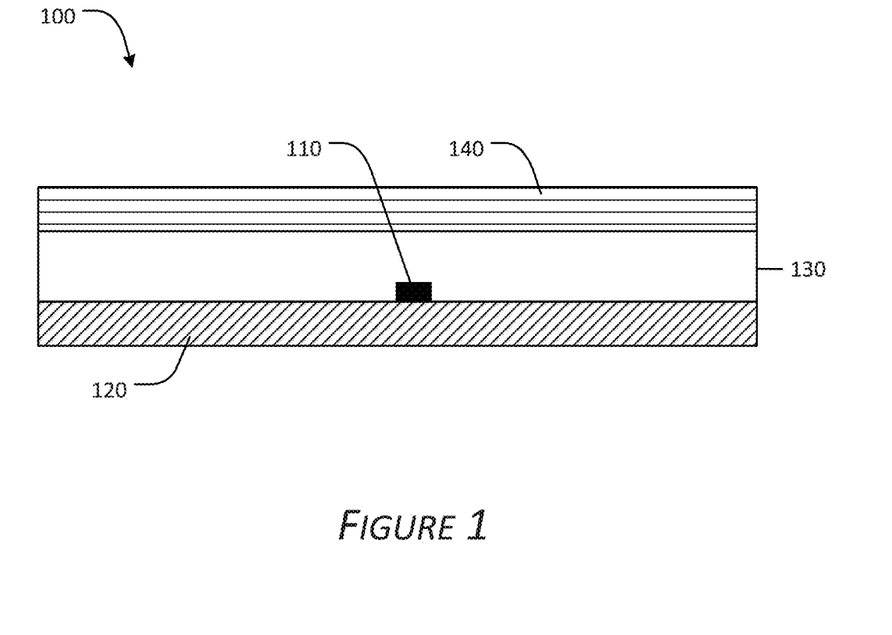
FIG. 1 is a side cross-sectional schematic of a comparative traditional electronic device.

FIG. 1 shows a traditional encapsulation 100 for moisture sensitive devices like electronic devices. The electronic device 110 is traditionally sandwiched between an electrically insulating substrate 120 and a barrier layer 140 and surrounded by a curable adhesive 130 sufficient to cover and surround the electronic device 110. The resulting wide edge seal protects the electronic device 110 from environment conditions such as oxygen and moisture, which can adversely affect the electronic device 110. Wide edge seals exploit the decay of diffusion across increasing distances, as the chemical potential of moisture and/or oxygen decreases exponentially from an exposed edge of the barrier material toward the electronic device, exponentially reducing the effects of moisture and/or oxygen on the electronic device 110. However, exploiting diffusion decay necessitates a sealed electronic device having a footprint that can be larger than otherwise necessary (i.e., an encapsulated/sealed electronic device is significantly larger than the electronic device 110 itself, as shown in FIG. 1). For example, an electronic device 110 can have a surface area of from about 100 square microns (µm$^2$) to about 100,000,000 µm$^2$. For example, the electronic device 110 can have a surface area of about 100 µm$^2$, 1000 µm$^2$, 10,000 µm$^2$, 100,000 µm$^2$, 1,000,000 µm$^2$, 10,000,000 µm$^2$, 100,000,000 µm$^2$, or anywhere in between. The electronic device 110 can have a length of from about 10 microns (µm) to about 10,000 µm, and likewise the electronic device 110 can have a width of from about 10 µm to about 10,000 µm. For example, the electronic device 110 can have a length and/or a width of about 10 µm, 100 µm, 1000 µm, 10,000 µm, or anywhere in between. The electronic device 110 can have a thickness of from about 5 µm to about 50 µm. For example, the electronic device 110 can have a thickness of about 5 µm, 10 µm, 15 µm, 20 µm, 25 µm, 30 µm, 35 µm, 40 µm, 45 µm, 50 µm, or anywhere in between. In the traditional method of sealing or encapsulating the electronic device, the electronic device 110 is placed on an electrically insulating substrate 120, a curable adhesive 130 is deposited around the electronic device 110 in an amount sufficient to cover and surround the electronic device 110, a barrier layer 140 is placed onto the curable adhesive 130, and the curable adhesive 130 is cured to create adherence between the electrically insulating substrate 120 and the barrier layer 140. The traditionally sealed electronic device could have an electrically insulating substrate 120, barrier layer 140, and cured adhesive 130 that extend from about 500 µm to about 10 mm (e.g., from 500 µm to 10 mm depending on dimensions of the electronic device 110) from an edge of the electronic device 110, thus increasing the footprint of the sealed electronic device 100 by several orders of magnitude or greater as compared to the electronic device 110.

The present method ensures an adequate seal without the large footprint necessitated by the traditional methods. As in the example of FIG. 2, a miniaturized sealed electronic device 200 can be provided by placing the electronic device 110 onto the electrically insulating substrate 120, wherein the electrically insulating substrate 120 is further attached to a sacrificial carrier substrate 250 by a releasable adhesive 260.

Figure 2:
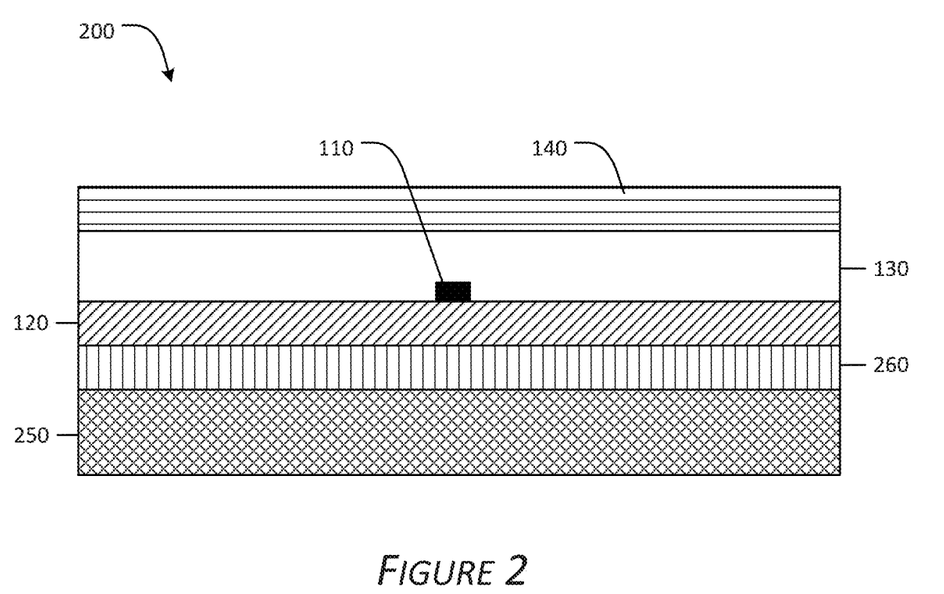
FIG. 2 is a side cross-sectional schematic of an electronic device showing layers of encapsulation according to certain aspects of the present disclosure.

As described throughout, the electrically insulating substrate 120 can be any suitable substrate, including a silicon wafer substrate, a gallium arsenide wafer substrate, a glass substrate, or a ceramic substrate (e.g., a yttrium stabilized zirconia (YSZ) substrate). The electrically insulating substrate 120 can have any suitable size and/or shape, such that at least one miniaturized sealed electronic device 200 can be fabricated and/or positioned thereupon. In some cases, the substrate can be sufficiently large such that a plurality of the miniaturized sealed electronic devices 200 can be fabricated and/or positioned thereupon and employed in concert as a single electronic system and/or the sealed electronic devices can be separated (e.g., by an optional dicing procedure), as discussed in detail below.

Also as described throughout, the sacrificial carrier substrate 250 can be any suitable substrate, including a silicon wafer substrate, a gallium arsenide wafer substrate, a glass substrate, or a ceramic substrate (e.g., a yttrium stabilized zirconia (YSZ) substrate). The sacrificial carrier substrate 250 can have any suitable size and/or shape and can optionally be subjected to dicing as described below.

The releasable adhesive 260, as described throughout, can be any suitable adhesive such that the adhesive properties can be selectively and controllably terminated. For example, the releasable adhesive 260 can be a photodegradable adhesive, a thermally degradable adhesive, a chemically degradable adhesive, a weakly adhering metal, a weakly adhering laminate, any suitable releasable adhesive, or any combination thereof. For example, a photodegradable adhesive can be released by exposure to a wavelength of light suitable to break adhesive bonds in the photodegradable adhesive, a thermally degradable can be released by exposure to a temperature sufficient to break adhesive bonds in the thermally degradable adhesive, and a chemically degradable adhesive can be released by exposure to a chemical sufficient to break adhesive bonds in the chemically degradable adhesive. In some cases, the releasable adhesive 260 can be released by physical force (e.g., prying).

Figure 3A:
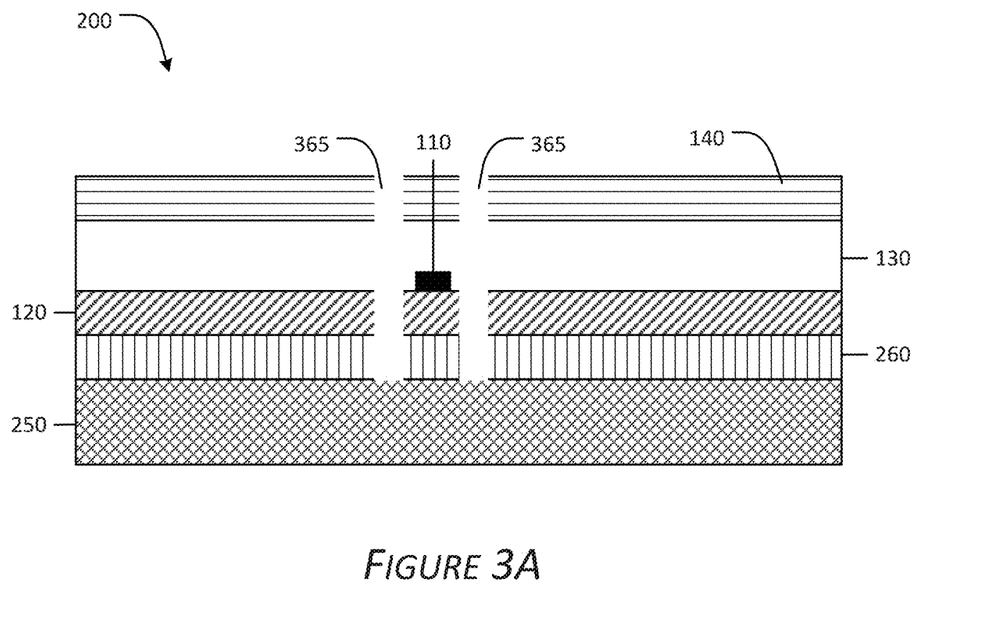
FIG. 3A is a side cross-sectional schematic of an electronic device showing cuts through certain layers of the encapsulation according to certain aspects of the present disclosure.

As shown in FIG. 3A, a cut 365 is made through the barrier layer 140, the curable adhesive 130, the electrically insulating substrate 120, and the releasable adhesive 260 of the miniaturized sealed electronic device 200. The cut 365 is made adjacent to the electronic device 110 creating a perimeter about the electronic device 110. In some cases, the perimeter about the device can have any suitable shape, for example, the perimeter can have a same shape as the electronic device 110. The cut 365 can be any suitable distance from the electronic device 110. For example, the distance between the electronic device 110 and the cut 365 can be from about 1 nanometer (nm) to about 1 mm, or any suitable distance such that a reduced footprint and concomitant protection of the electronic device 110 are realized. For example, the distance between the electronic device 110 and the first cut 370 can be about 1 nm, 2 nm, 3 nm, 4 nm, 5 nm, 6 nm, 7 nm, 8 nm, 9 nm, 10 nm, 15 nm, 20 nm, 25 nm, 30 nm, 35 nm, 40 nm, 45 nm, 50 nm, 55 nm, 60 nm, 65 nm, 70 nm, 75 nm, 80 nm, 85 nm, 90 nm, 95 nm, 100 nm, 200 nm, 300 nm, 400 nm, 500 nm, 600 nm, 700 nm, 800 nm, 900 nm, 1 μm, 2 μm, 3 μm, 4 μm, 5 μm, 6 μm, 7 μm, 8 μm, 9 μm, 10 μm, 20 μm, 30 μm, 40 μm, 50 μm, 60 μm, 70 μm, 80 μm, 90 μm, 100 μm, 200 μm, 300 μm, 400 μm, 500 μm, 600 μm, 700 μm, 800 μm, 900 μm, 1 mm, or greater, or anywhere in between. The cut 365 can be created by any suitable cutting means, including, for example, laser cutting, mechanical cutting (e.g., employing a scribe, a diamond saw or a microtome), chemical cutting (e.g., wet etching), dry etching (e.g., reactive ion etching), or plasma cutting. A width of the cut 365 can be determined by the suitable cutting means. For example, the cut 365 created by a diamond saw having a saw blade thickness of 150 μm can impart a channel about the electronic device 110 having a channel width of about 150 μm.

Figure 3B:
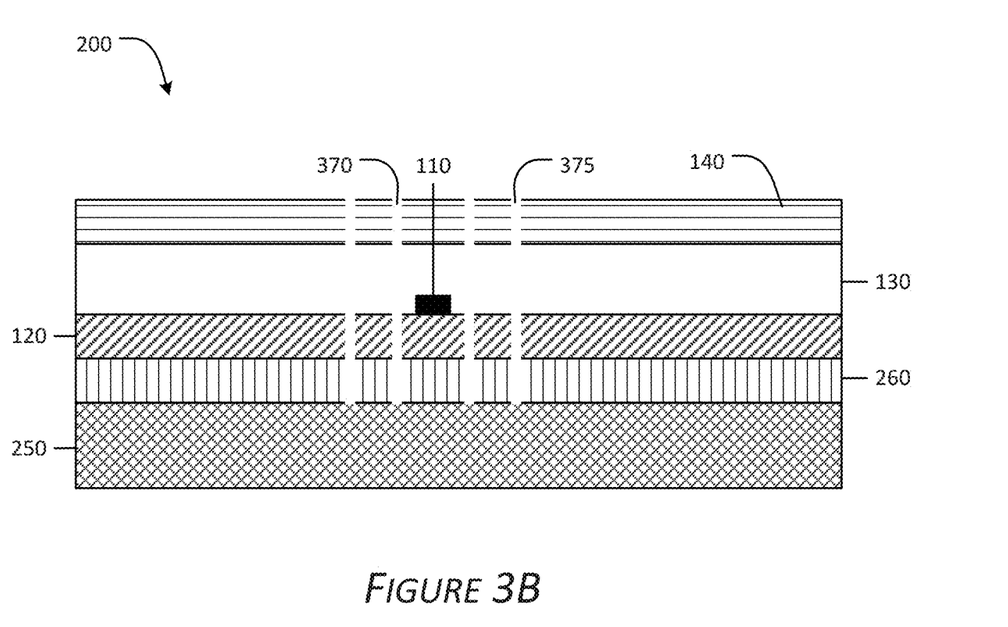
FIG. 3B is a side cross-sectional schematic of an electronic device showing cuts through certain layers of the encapsulation according to certain aspects of the present disclosure.

In a further example, as shown in FIG. 3B, cuts 370 and 375 can be made through the barrier layer 140, the curable adhesive 130, the electrically insulating substrate 120, and the releasable adhesive 260 of the miniaturized sealed electronic device 200. A first cut 370 is made adjacent to the electronic device 110 creating a perimeter about the electronic device 110. In some cases, the perimeter about the device can have any suitable shape, for example, the perimeter can have a same shape as the electronic device 110. The first cut 370 can be any suitable distance from the electronic device 110. For example, the distance between the electronic device 110 and the first cut 370 can be from about 1 nanometer (nm) to about 1 mm, or any suitable distance such that a reduced footprint and concomitant protection of the electronic device 110 are realized. For example, the distance between the electronic device 110 and the first cut 370 can be about 1 nm, 2 nm, 3 nm, 4 nm, 5 nm, 6 nm, 7 nm, 8 nm, 9 nm, 10 nm, 15 nm, 20 nm, 25 nm, 30 nm, 35 nm, 40 nm, 45 nm, 50 nm, 55 nm, 60 nm, 65 nm, 70 nm, 75 nm, 80 nm, 85 nm, 90 nm, 95 nm, 100 nm, 200 nm, 300 nm, 400 nm, 500 nm, 600 nm, 700 nm, 800 nm, 900 nm, 1 μm, 2 μm, 3 μm, 4 μm, 5 μm, 6 μm, 7 μm, 8 μm, 9 μm, 10 μm, 20 μm, 30 μm, 40 μm, 50 μm, 60 μm, 70 μm, 80 μm, 90 μm, 100 μm, 200 μm, 300 μm, 400 μm, 500 μm, 600 μm, 700 μm, 800 μm, 900 μm, 1 mm, or greater, or anywhere in between. A second cut 375 is made about the electronic device 110 creating a second perimeter that is optionally concentric to the first perimeter. The second cut 375 can be any suitable distance from the first cut 370. The distance between the first cut 370 and the second cut 375 can be from about 10 nm to about 10 μm. For example, the distance between the first cut 370 and the second cut 375 can be about 10 nm, 15 nm, 20 nm, 25 nm, 30 nm, 35 nm, 40 nm, 45 nm, 50 nm, 55 nm, 60 nm, 65 nm, 70 nm, 75 nm, 80 nm, 85 nm, 90 nm, 95 nm, 100 nm, 200 nm, 300 nm, 400 nm, 500 nm, 600 nm, 700 nm, 800 nm, 900 nm, 1 μm, 2 μm, 3 μm, 4 μm, 6 μm, 7 μm, 8 μm, 9 μm, 10 μm, or anywhere in between. The first cut 370 and the second cut 375 can be created by any suitable cutting means, including, for example, laser cutting, mechanical cutting (e.g., employing a scribe, a diamond saw or a microtome), chemical cutting (e.g., wet etching), dry etching (e.g., reactive ion etching), or plasma cutting.

After cutting, the barrier layer 140, the curable adhesive 130, the electrically insulating substrate 120, and the releasable adhesive 260 between the first cut 370 and the second cut 375 can be removed by selectively releasing the releasable adhesive 260 between the first cut 370 and the second cut 375. Selectively releasing the releasable adhesive 260 can be performed by any suitable means, including exposing a photodegradable releasable adhesive to a wavelength of light that can break adhesive bonds in the releasable adhesive, exposing a thermally degradable releasable adhesive to a temperature that can break adhesive bonds in the releasable adhesive, exposing a chemically degradable releasable adhesive to a chemical that can break adhesive bonds in the releasable adhesive, micromachining, wet etching, dry etching, or mechanical cutting. In some non-limiting examples, a single cut can be made employing a cutting means such that the single cut provides a channel about the electronic device 110 having a desired width. For example, the single cut can be made with a diamond saw having a saw blade thickness of 100 μm, thus providing a 100 μm wide channel about the electronic device 110.

Figure 4:
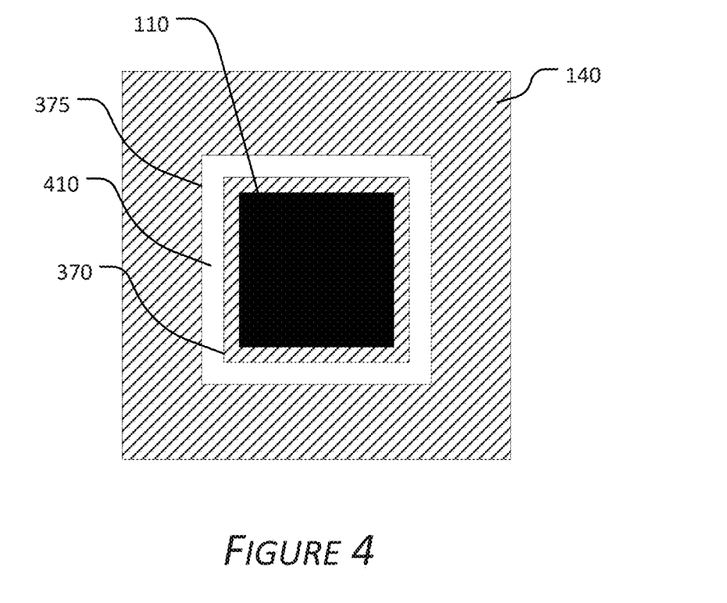
FIG. 4 is a top planar schematic of an electronic device showing a channel around the electronic device according to certain aspects of the present disclosure.
Figure 5:
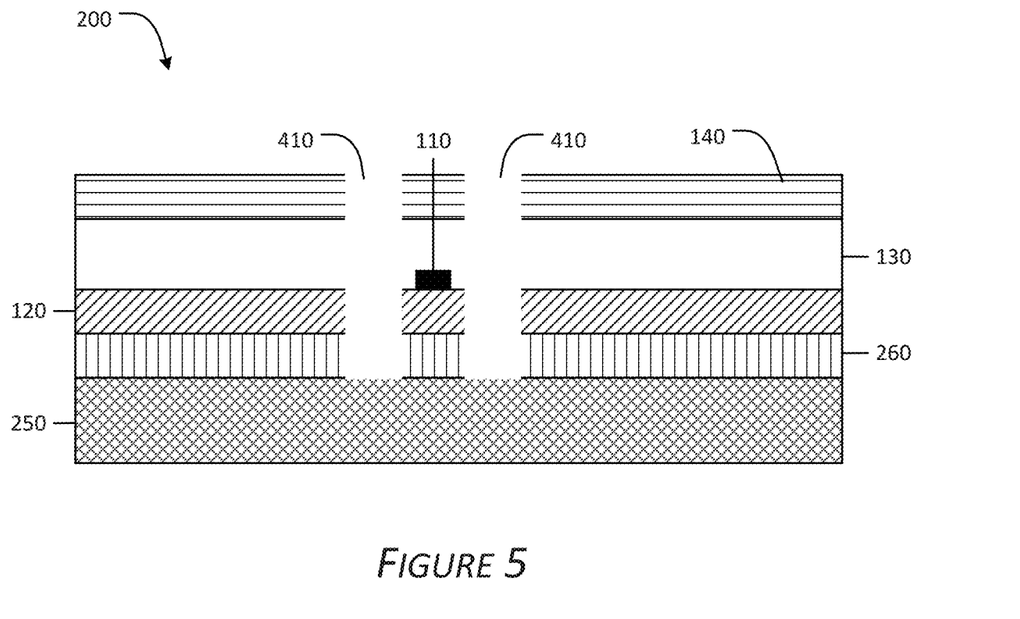
FIG. 5 is a side cross-sectional schematic of an electronic device showing a channel around the electronic device according to certain aspects of the present disclosure.

FIG. 4 is a top view schematic of the electronic device 110 surrounded by the first cut 370 and the second cut 375, wherein the barrier layer 140, the curable adhesive 130, the electrically insulating substrate 120, and the releasable adhesive 260 are removed from between the first cut 370 and the second cut 375 to provide a channel 410 that surrounds the electronic device 110. The channel 410 optionally extends from the barrier layer 140 to the sacrificial carrier substrate 250 as in the example of FIG. 5.

In some non-limiting examples, after removing the barrier layer 140, the curable adhesive 130, the electrically insulating substrate 120, and the releasable adhesive 260 to create the channel 410, further processing can be performed to tailor characteristics of the channel 410 such as shape, dimension, and volume. For example, an optional selective etching procedure can be performed to further remove material from the curable adhesive 130, thus further minimizing the amount of curable adhesive 130 about the electronic device 110. Performing the selective etching procedure in this manner can provide the barrier layer 140 and the electrically insulating substrate 120 having a surface area larger than a surface area of the curable adhesive 130, wherein a cross-sectional view of the barrier layer 140, the curable adhesive 130, and the electrically insulating substrate 120 can have an hour glass shape.

Figure 6:
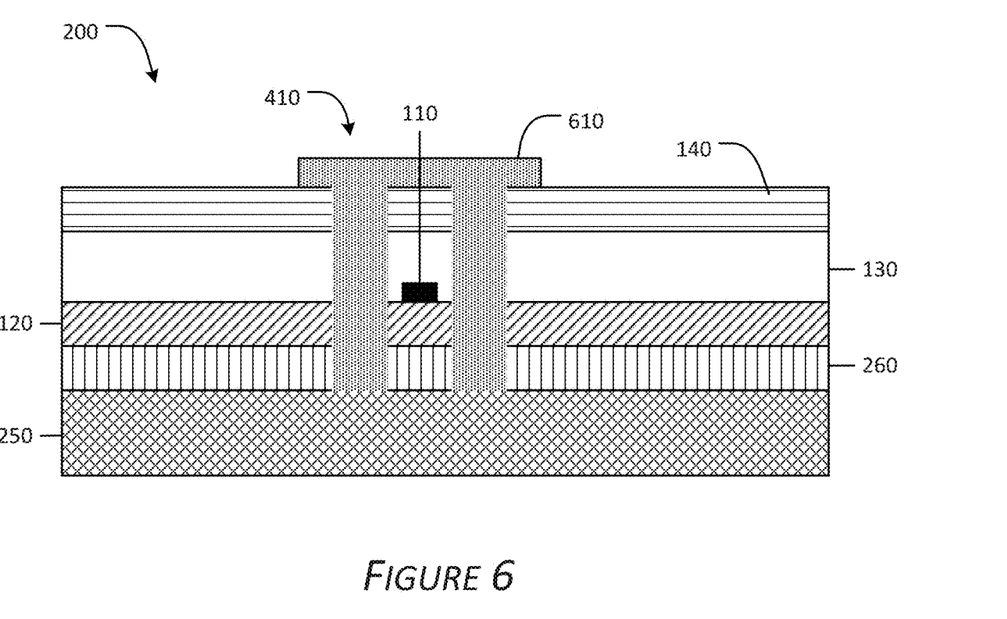
FIG. 6 is a side cross-sectional schematic of an electronic device showing a channel filled with a curable sealant around the electronic device according to certain aspects of the present disclosure.

After removing the barrier layer 140, the curable adhesive 130, the electrically insulating substrate 120, and the releasable adhesive 260 to create the channel 410, the channel 410 is filled with a sealant 610, as shown in FIG. 6. The sealant 610 can be any suitable material that prevents ingress of oxygen, moisture, or any other contaminant that is detrimental to electronic device function. In some non-limiting examples, the sealant 610 is a curable sealant, for example, a thermoplastic polymer, a thermoset resin, an epoxy, or a metal ink. In some cases, the sealant 610 can be a pure metal, an alloy, a ceramic, or a ceramic-metallic composite (cermet). The sealant 610 can be deposited by stencil printing, a damascene process, spin-coating, dip-coating, ink-jet printing, roll-to-roll printing, chemical vapor deposition (e.g., evaporation or sputtering in the example of a pure metal or alloy), or any combination thereof. The sealant 610 is optionally deposited only in the channel 410, leaving the barrier layer 140 exposed to the environment in which the miniaturized sealed electronic device 200 is placed. Thus, a thickness of the miniaturized sealed electronic device 200 can be dependent on the barrier layer 140, the curable adhesive 130, and the electrically insulating substrate 120, further maintaining miniaturization of the miniaturized sealed electronic device 200. Alternatively, the sealant, as shown in FIG. 6, may fill the channel and cover the barrier layer 140 such that the sealant, rather than the barrier layer, is exposed to the environment into which the miniaturized sealed electronic device is placed. The sealant 610 is subsequently cured to produce a seal around the electronic device 110.

In some non-limiting examples, an optional rigid moisture barrier cap can be deposited onto the barrier layer 140. The rigid moisture barrier cap can be glass, ceramic, polymer, metal, any suitable moisture barrier material, or any combination thereof. In some cases, the rigid moisture barrier cap can be deposited by any suitable means as described above. Optionally, the rigid moisture barrier cap can be applied employing any suitable adhesive.

Figure 7:
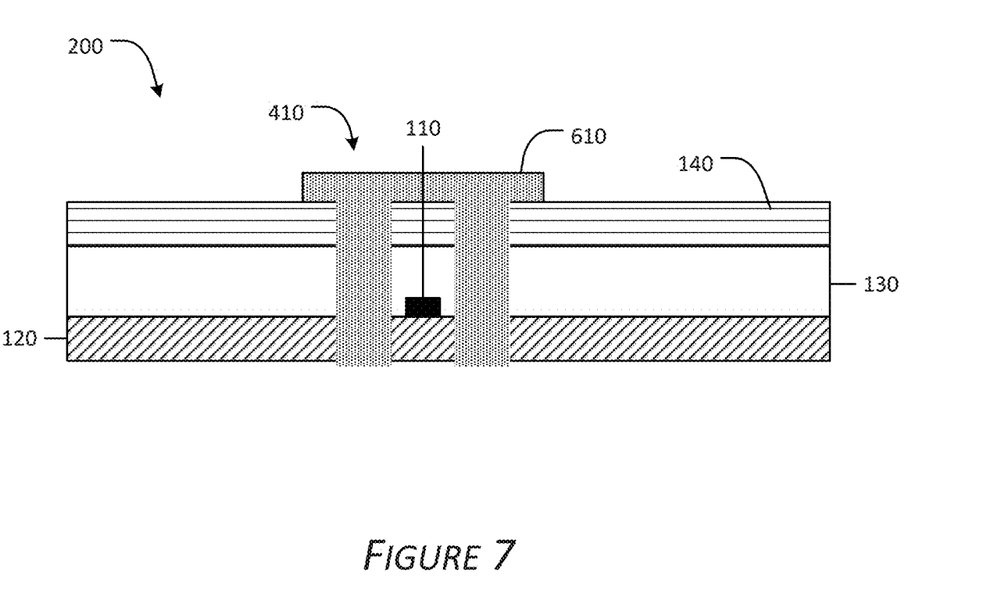
FIG. 7 is a side cross-sectional schematic of an electronic device of FIG. 6 following removal of a sacrificial carrier substrate according to certain aspects of the present disclosure.

After depositing and/or curing the sealant 610, the electrically insulating substrate 120 is separated from the sacrificial carrier substrate 250 as shown in FIG. 7. Separating electrically insulating substrate 120 from the sacrificial carrier substrate 250 can be performed by releasing the releasable adhesive 260. Releasing the releasable adhesive 260 is performed by any of one or more means, depending on the type of adhesive that is used (e.g., photodegradable adhesive, a thermally degradable adhesive, a chemically degradable adhesive, a weakly adhering metal, a weakly adhering laminate, or the like). For example, an UV or heat can be applied to debond a photodegradable or thermally degradable adhesive, respectively.

Figure 8:
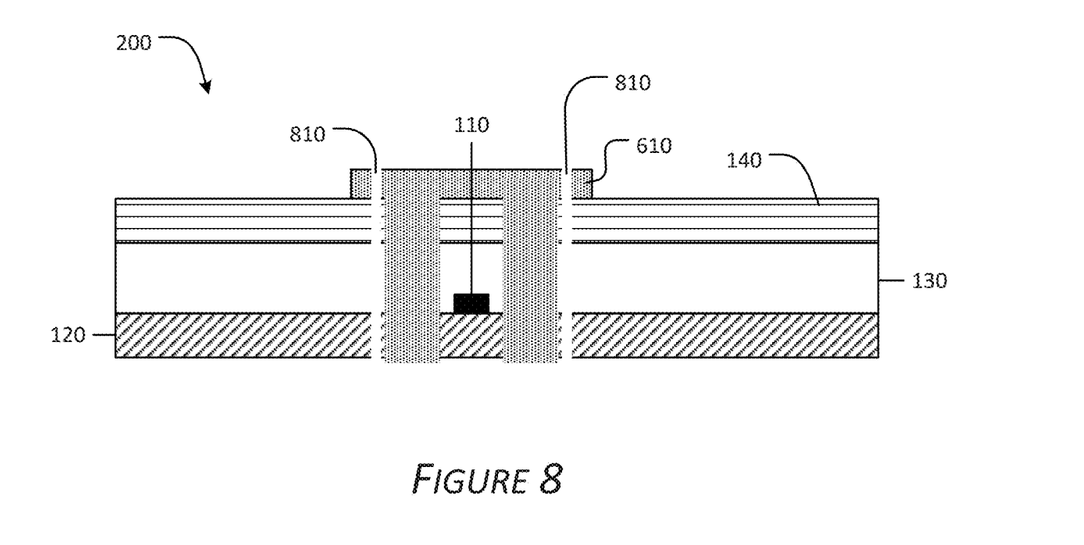
FIG. 8 is a side cross-sectional schematic of an electronic device of FIG. 7 with a perimeter cut around the electronic device according to certain aspects of the present disclosure.

After separating the electrically insulating substrate 120 from the sacrificial carrier substrate 250, the barrier layer 140, the curable adhesive 130, and the electrically insulating substrate 120 can be diced as shown in FIG. 8, by cuts 810 through the sealant 610, the electrically insulating substrate 120 and the cured adhesive 130 electron surrounding the electronic device 110 to provide the miniaturized sealed electronic device 200, as shown in the example of FIG. 8. Dicing can be performed by any suitable means known in the art, including, for example, laser cutting, and/or mechanical cutting to provide a miniaturized sealed electronic device 200. After dicing, the final miniaturized sealed electronic device with a smaller footprint that achieved with traditional methods is achieved, as shown in FIG. 9.

The methods described herein optionally include creating sealed conductive feedthroughs within the electrically insulating substrate. Optionally the electronic device is positioned on the substrate so as to have an anode and a cathode addressable on the side of the electronic device juxtaposed to the electrically insulating substrate, which are optionally accessible through the sealed conductive feedthroughs. Optionally, the methods described herein include welding (e.g., by laser welding) a cap over the electrically insulating substrate.

Figure 9:
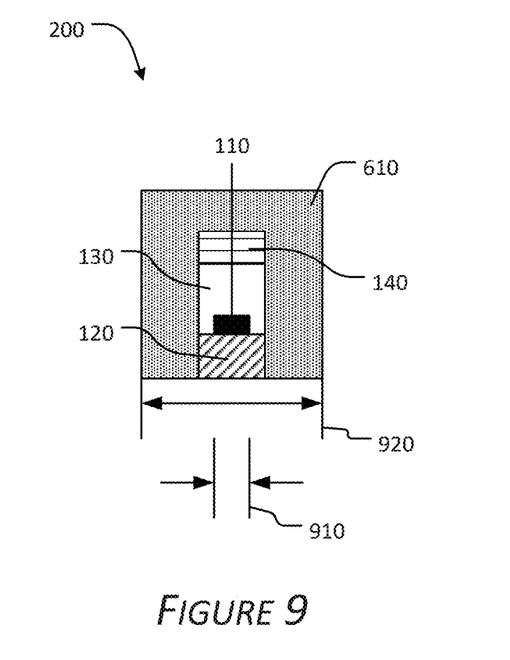
FIG. 9 is a side cross-sectional schematic of a fully encapsulated electronic device according to certain aspects of the present disclosure.

The miniaturized sealed electronic device 200 disclosed herein, and exemplified in FIG. 9, comprises an electronic device 110, an electrically insulating substrate 120, a barrier layer 140, cured adhesive 130 and a sealant 610. The electronic device can be any suitable electronic device, including a battery, a photovoltaic device, a resistor, a capacitor, a transistor, a memristor, a light-emitting diode, an organic light-emitting diode, any suitable electronic device, or any combination thereof. The substrate can include any suitable substrate, preferably a substrate that is at least partially electrically insulating, including a silicon wafer substrate, a gallium arsenide wafer substrate, a glass substrate, or a ceramic substrate (e.g., a yttrium stabilized zirconia (YSZ) substrate). The cured adhesive can be any curable adhesive submitted to proper curing techniques. For example, the cured adhesive can be a thermoplastic polymer, a thermoset resin, an epoxy, or any combination thereof. The barrier layer can be any suitable barrier material, including metals, metal oxides, metal nitrides, metal carbides, ceramics, polymers, cermets, or any combination thereof. The sealant can include a curable adhesive, a thermoplastic polymer, a thermoset resin, an epoxy, a metal, a cermet, or any combination thereof.

Thus, disclosed herein are miniaturized sealed electronic devices for in vitro and in vivo applications. The sealed electronic device includes an electrically insulating layer and a barrier layer with an electronic device between the electrically insulating layer and the barrier layer, wherein the electronic device is encapsulated by a first cured adhesive and wherein the electrically insulating layer and a barrier layer have a perimeter that is greater than the perimeter of the electronic device; and a sealant at the perimeter of the electrically insulating layer and the barrier layer. The encapsulated/sealed electronic device, as exemplified in FIG. 9, includes (a) an electronic device 110 positioned on an electrically insulating substrate 120, (b) cured adhesive 130 surrounding the electronic device 110 and between the electrically insulating substrate 120 and a barrier layer 140, (c) a sealant 610 surrounding the cured adhesive 130 and the electrically insulating substrate 120, wherein the sealant 610 comprises an edge seal around the cured adhesive 130 and the electrically insulating substrate 120, wherein the edge seal is 1 nanometer (nm) to about 1 mm from the electronic device. The edge seal, as viewed in cross section, is narrow, for example, no more than 10 times (e.g., 2 times, 3 times, 4 times, 5 times, 6 times, 7 times, 8 times, or 9 times) wider than the width of the electronic device 110, and wherein the edge seal is less than five times the width of the electronic device. For example, the electronic device 110 can have a cross-sectional dimension 910 of 50 µm and the edge seal including the sealant 610 can have a cross-sectional dimension 920 of 250 µm or less. Thus, the miniaturized sealed electronic device can be an electronic device made according to the methods described herein and having a reduced area (e.g., a reduced footprint) when compared to conventional electronic devices fabricated in, for example, a layer-by-layer process. Optionally, as shown in FIG. 9, the sealant 610 covers the barrier layer 140. The miniaturized sealed electronic device optionally further includes a glass cap and/or an anode and a cathode addressable on the same side of the electronic device. Optionally, the miniaturized sealed electronic device includes one or more sealed conductive feedthroughs within the substrate with an anode and a cathode addressable on a same side of the electronic device over the sealed conductive feedthroughs. The miniaturized sealed conductive device optionally includes a cap laser welded to the substrate.

Figure 10:
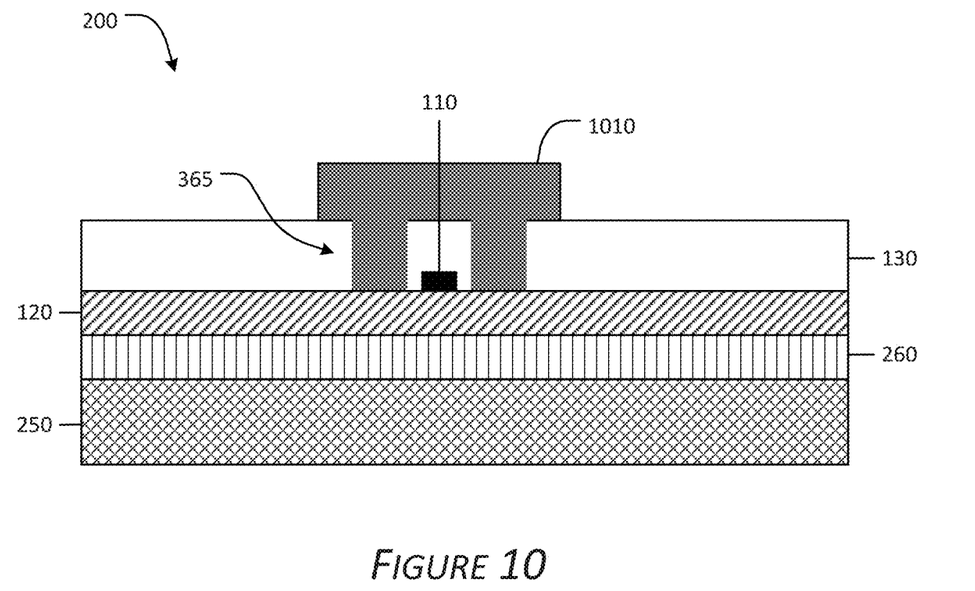
FIG. 10 is a side cross-sectional schematic of a fully encapsulated electronic device according to certain aspects of the present disclosure.

In certain embodiments, the miniaturized sealed electronic device 200 disclosed herein, and exemplified in FIG. 10, comprises an electronic device 110, an electrically insulating substrate 120, cured adhesive 130 and a barrier material cap 1010. The barrier material cap 1010 can be any suitable barrier material, including metals, metal oxides, metal nitrides, metal carbides, ceramics, polymers, cermets, or any combination thereof. Optionally, as shown in FIG. 10, the electronic device 110 is encapsulated by the barrier material cap 1010. In certain embodiments, the barrier material cap 1010 is thermally pressed into the cured adhesive 130 and further thermally pressed into contact with the electrically insulating substrate 120, thereby sealing the electronic device 110. In certain embodiments, the cured adhesive 130 is a pressure sensitive adhesive that is cured during thermally pressing the barrier material cap 1010.

Figure 11:
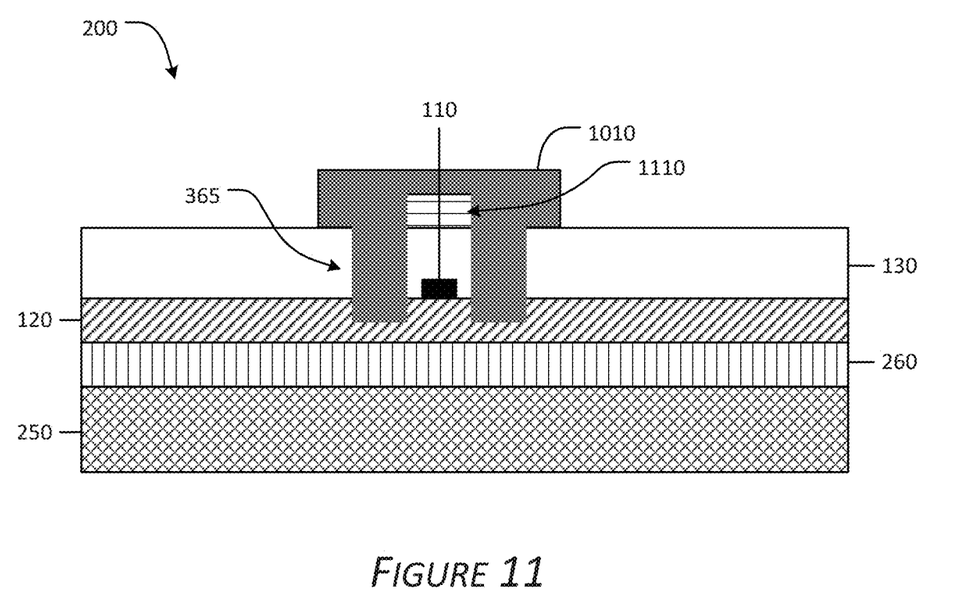
FIG. 11 is a side cross-sectional schematic of a fully encapsulated electronic device according to certain aspects of the present disclosure.

In certain embodiments, the miniaturized sealed electronic device 200 disclosed herein, and exemplified in FIG. 11, comprises an electronic device 110, an electrically insulating substrate 120, cured adhesive 130, a second curable adhesive 1110, and a barrier material cap 1010. Optionally, as shown in FIG. 11, the electronic device 110 is encapsulated by applying the second curable adhesive 1110, positioning the barrier material cap 1010 into the cut 365 (see FIG. 3), pressing the barrier material cap 1010 into the cut 365 at least partially cut into the electrically insulating substrate 120, and curing the second curable adhesive 1110. In certain aspects, pressing the barrier material cap 1010 into the cut 365 at least partially cut into the electrically insulating substrate 120 further forces the second curable adhesive 1110 into the cut 365, thereby encapsulating the electronic device 110 with the barrier material cap 1010 and the second curable adhesive 1110. In certain embodiments, the second curable adhesive 1110 is thermally cured, optically cured (e.g., curing by ultraviolet light), chemically cured, or any combination thereof.

In certain embodiments, the miniaturized sealed electronic devices described herein can be used in a variety of environments (including, e.g., in vivo) where an electronic device, including, for example, a battery, a photovoltaic device, a resistor, a capacitor, a transistor, a memristor, a light-emitting diode, an organic light-emitting diode, any suitable electronic device, or any combination thereof, is needed. For example, the miniaturized sealed electronic device can be employed in environments having moisture, oxygen, corrosives, certain acids, certain bases, any other compound detrimental to an electronic device, or any combination thereof.

As discussed herein, the miniaturized sealed electronic devices may be used as a component of medical implantations, or as a medical implantation (e.g., included in powered contact lenses, radio frequency identification devices, medicament delivery systems, imaging systems, neuromodulation devices, monitoring or diagnostic devices, and/or implanted sensors, to name a few).

For example, the miniaturized sealed electronic device can be such that, when employed in vitro or in vivo, moisture and/or oxygen found in an immediate environment about the miniaturized sealed electronic device cannot penetrate the encapsulation thereby accelerating degradation and failure of the electronic device.

The practice of the present disclosure will employ, unless otherwise indicated, conventional techniques of nanotechnology, nano-engineering, nanofabrication, microchip fabrication, chip processing, laser-beam welding, and pharmacology, which are within the skill of the art. To facilitate understanding of the disclosure, a number of terms and abbreviations as used herein are defined below as follows:

When introducing elements of the present disclosure or the embodiment(s) thereof, the articles "a," "an," "the," and "said" are intended to mean that there are one or more of the elements. The terms "comprising," "including," and "having" are intended to be inclusive and mean that there may be additional elements other than the listed elements.

The term "and/or" when used in a list of two or more items, means that any one of the listed items can be employed by itself or in combination with any one or more of the listed items. For example, the expression "A and/or B" is intended to mean either or both of A and B, i.e. A alone, B alone or A and B in combination. The expression "A, B, and/or C" is intended to mean A alone, B alone, C alone, A and B in combination, A and C in combination, B and C in combination or A, B, and C in combination.

As used herein, a "subject" or "individual" refers to an animal, a non-human mammal or a human. A "subject in need" is a subject having a need for therapy, diagnosis or other uses of the nanoparticles disclosed herein. As used herein, "animal" includes a pet, a farm animal, an economic animal, a sport animal and an experimental animal, such as a cat, a dog, a horse, a cow, an ox, a pig, a donkey, a sheep, a lamb, a goat, a mouse, a rabbit, a chicken, a duck, a goose, a primate, including a monkey and a chimpanzee. In some cases, the subject is a patient being treated for a specific condition.

It is understood that aspects and embodiments of the disclosure described herein include "consisting" and/or "consisting essentially of" aspects and embodiments.

Various aspects of this disclosure are presented in a range format. It should be understood that the description in range format is merely for convenience and brevity and should not be construed as an inflexible limitation on the scope of the disclosure. Accordingly, the description of a range should be considered to have specifically disclosed all the possible sub-ranges as well as individual numerical values within that range. For example, description of a range such as from 1 to 6 should be considered to have specifically disclosed sub-ranges such as from 1 to 3, from 1 to 4, from 1 to 5, from 2 to 4, from 2 to 6, from 3 to 6 etc., as well as individual numbers within that range, for example, 1, 2, 3, 4, 5, and 6. This applies regardless of the breadth of the range.

Other objects, advantages and features of the present disclosure will become apparent from the following specification taken in conjunction with the accompanying drawings.

While various aspects and embodiments have been disclosed herein, other aspects and embodiments will be apparent to those skilled in the art. The various aspects and embodiments disclosed herein are for purposes of illustration and are not intended to be limiting, with the true scope being indicated by the following claims.

What we claim:

1. A sealed electronic device, comprising
an electrically insulating layer and a barrier layer with an electronic device between the electrically insulating layer and the barrier layer, wherein the electronic device is encapsulated by a cured adhesive and wherein a perimeter of the electrically insulating layer and the barrier layer is greater than a perimeter of the electronic device; and
a sealant at the perimeter of the electrically insulating layer and the barrier layer.

2. The sealed electronic device of claim 1, wherein the sealant is selected from the group consisting of a thermoplastic polymer, a thermoset resin, an epoxy, and a metal.

3. The sealed electronic device of claim 1, wherein the barrier layer comprises a barrier layer thin film positioned over and beyond the perimeter of the electronic device or a barrier layer cap positioned over and about the electronic device.

4. The sealed electronic device of claim 3, wherein the barrier layer cap is configured to be sealed to the electrically insulating layer about the perimeter of the electronic device.

5. The sealed electronic device of claim 3, wherein the barrier layer cap comprises glass, ceramic, polymer, or metal.

6. The sealed electronic device of claim 4, wherein the barrier layer cap is thermally sealed to the electrically insulating layer, is chemically sealed to the electrically insulating layer, or is photo-curably sealed to the electrically insulating layer.

7. The sealed electronic device of claim 1, wherein the cured adhesive and the sealant are photo-cured.

8. The sealed electronic device of claim 1, wherein the cured adhesive and the sealant are thermally-cured.

9. The sealed electronic device of claim 1, wherein the cured adhesive and the sealant are chemically-cured.

10. The sealed electronic device of claim 1, wherein the electronic device is a solid state battery, a light emitting diode, a photovoltaic device, or a sensor.

11. The sealed electronic device of claim 6, wherein the barrier layer cap is photo-curably sealed to the electrically insulating layer.

12. The sealed electronic device of claim 6, wherein the barrier layer cap is thermally sealed to the electrically insulating layer.

13. The sealed electronic device of claim 6, wherein the barrier layer cap is chemically sealed to the electrically insulating layer.

14. The sealed electronic device of claim 1, wherein the sealed electronic device is a medical implant.

15. The sealed electronic device of claim 1, wherein the electronic device has a length and a width of from about 10 microns (μm) to about 10,000 μm.

16. The sealed electronic device of claim 1, wherein the electronic device has a thickness of from about 5 microns (μm) to about 50 μm.

17. The sealed electronic device of claim 1, wherein the electrically insulating layer is selected from the group consisting of a silicon wafer substrate, a gallium arsenide wafer substrate, a glass substrate, and a ceramic substrate.

18. The sealed electronic device of claim 1, wherein the sealant at the perimeter of the electrically insulating layer and the barrier layer is 1 nanometer (nm) to about 1 mm from the electronic device.

19. The sealed electronic device of claim 18, wherein a cross section of the sealant at the perimeter of the electrically insulating layer and the barrier layer is no more than 10 times wider than a width of the electronic device.

20. The sealed electronic device of claim 1, further comprising one or more sealed conductive feedthroughs addressable on a same side of the electronic device.

21. The sealed electronic device of claim 20, wherein the sealed conductive feedthroughs addressable on a same side of the electronic device comprise an anode feedthrough and a cathode feedthrough.

* * * * *